(12) United States Patent
Titjung et al.

(10) Patent No.: US 11,240,914 B2
(45) Date of Patent: Feb. 1, 2022

(54) COMPONENT CARRIER WITH EMBEDDED COMPONENT HAVING PADS CONNECTED IN DIFFERENT WIRING LAYERS

(71) Applicant: AT&S Austria Technologie & Systemtechnik Aktiengesellschaft, Leoben (AT)

(72) Inventors: Florian Titjung, Kapfenberg (AT); Wolfgang Schrittwieser, Kapfenberg (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 16/579,385

(22) Filed: Sep. 23, 2019

(65) Prior Publication Data
US 2020/0100365 A1    Mar. 26, 2020

(30) Foreign Application Priority Data
Sep. 25, 2018  (EP) ..................................... 18196460

(51) Int. Cl.
*H01L 23/52* (2006.01)
*H05K 1/18* (2006.01)
(Continued)

(52) U.S. Cl.
CPC ............. *H05K 1/186* (2013.01); *H01L 24/08* (2013.01); *H05K 1/0298* (2013.01); *H05K 1/115* (2013.01);
(Continued)

(58) Field of Classification Search
CPC .... H01L 23/52; H01L 23/5226; H01L 23/528
See application file for complete search history.

(56) References Cited

U.S. PATENT DOCUMENTS 8,575,755 B1* 11/2013 Christman ............. H01L 22/10
257/773
2005/0184393 A1 8/2005 Hirakawa
(Continued)

FOREIGN PATENT DOCUMENTS

EP     1 321 980 A1    6/2003

OTHER PUBLICATIONS

Schweiger, D.; Communication Pursuant to Article 94(3) EPC in Application No. 18 196 460.2; pp. 1-8; Aug. 24, 2021; European Patent Office; Postbus 5818; 2280 HV Rijswijk, Netherlands.
(Continued)

*Primary Examiner* — Jae Lee
(74) *Attorney, Agent, or Firm* — Robert A. Blaha; Smith Tempel Blaha LLC

(57) ABSTRACT

A component carrier includes a stack having at least one electrically insulating layer structure and a plurality of electrically conductive layer structures, and a component embedded in the stack and having an array of pads on a main surface of the component. A first electrically conductive connection structure of the electrically conductive layer structures electrically connects a first pad of the pads up to a first wiring plane, and a second electrically conductive connection structure of the electrically conductive layer structures electrically connects a second pad of the pads up to a second wiring plane being different from the first wiring plane.

9 Claims, 2 Drawing Sheets

(51) Int. Cl.
*H01L 23/00* (2006.01)
*H05K 1/02* (2006.01)
*H05K 1/11* (2006.01)

(52) U.S. Cl.
CPC .............. *H01L 2224/0231* (2013.01); *H01L 2224/02331* (2013.01); *H01L 2224/02373* (2013.01); *H01L 2224/02375* (2013.01); *H01L 2224/02379* (2013.01); *H01L 2224/02381* (2013.01)

(56) References Cited

U.S. PATENT DOCUMENTS

| | | |
|---|---|---|
| 2005/0253244 A1 | 11/2005 | Chang |
| 2009/0057001 A1 | 3/2009 | Jung et al. |
| 2011/0121445 A1 | 5/2011 | Mori et al. |
| 2012/0188734 A1 | 7/2012 | Mikado et al. |
| 2014/0077394 A1* | 3/2014 | Chang .................. H01L 23/4334 257/782 |
| 2015/0162309 A1* | 6/2015 | Vincent ............... H01L 25/0657 257/777 |
| 2015/0325925 A1* | 11/2015 | Kamgaing .............. H01L 21/52 343/893 |
| 2018/0044169 A1 | 2/2018 | Hatcher, Jr. et al. |
| 2018/0054891 A1* | 2/2018 | Ishihara ............ H01L 23/49811 |
| 2019/0287872 A1* | 9/2019 | Goh .................... H01L 25/0652 |

OTHER PUBLICATIONS

Pfeil, Charles et al.; "HDI layers, stackups for large, dense PCBs", Dec. 2014 @BULLET The PCB Design Magazine 1; High Density Interconnects, Dec. 1, 2014 (Dec. 1, 2014), pp. 1-69, XP055832927, Retrieved from the Internet: URL:http://www.magazines007.com/pdf/PCBD-Dec2014.pdf [retrieved on Aug. 18, 2021].

* cited by examiner

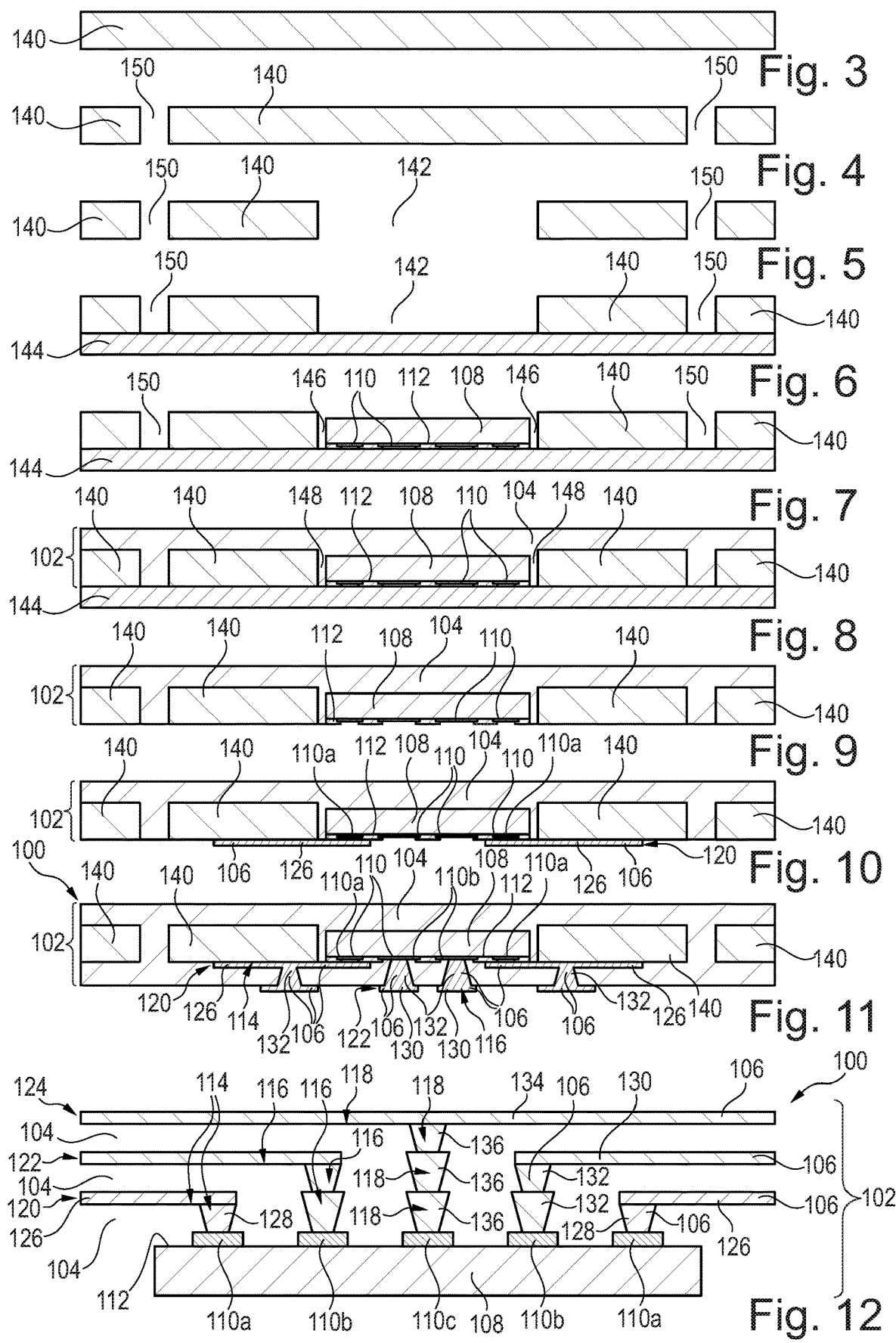

COMPONENT CARRIER WITH EMBEDDED COMPONENT HAVING PADS CONNECTED IN DIFFERENT WIRING LAYERS

TECHNICAL FIELD

The invention relates to a method of manufacturing a component carrier and to a component carrier.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

SUMMARY

There may be a need to efficiently embed and connect a component having multiple pads in a component carrier.

According to an exemplary embodiment of the invention, a component carrier is provided which comprises a stack comprising at least one electrically insulating layer structure (in particular a plurality of electrically insulating layer structures) and a plurality of electrically conductive layer structures, and a component (in particular a plurality of components) embedded in the stack and comprising an array of pads on a main surface of the component (optionally also comprising a further array of pads on an opposing other main surface of the component), wherein a first electrically conductive connection structure of the electrically conductive layer structures electrically connects a first pad (in particular a plurality of first pads) of the pads up to (in particular only up to) or into a first wiring plane, and wherein a second electrically conductive connection structure of the electrically conductive layer structures electrically connects a second pad (in particular a plurality of second pads) of the pads up to (in particular only up to) or into a second wiring plane being different from the first wiring plane.

According to another exemplary embodiment of the invention, a method of manufacturing a component carrier is provided, wherein the method comprises forming a stack comprising at least one electrically insulating layer structure and a plurality of electrically conductive layer structures, embedding a component, comprising an array of pads on a main surface of the component, in the stack, electrically connecting a first pad of the pads up to or into a first wiring plane by a first electrically conductive connection structure of the electrically conductive layer structures, and electrically connecting a second pad of the pads up to or into a second wiring plane, being different from the first wiring plane, by a second electrically conductive connection structure of the electrically conductive layer structures.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "component" may particularly denote any inlay to be integrated in a component carrier stack, which inlay fulfills a certain (in particular an electric) function and which can be connected to electrically conductive layers structures of the stack via its one or more pads.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "wiring plane" may particularly denote a plane parallel to a plane of the layer structures of the stack, parallel to the main surface of the component and/or parallel to main surfaces of the component carrier. Within the wiring plane, one or more electrically conductive traces may extend. Such traces of one wiring plane may be parallel to traces of another one of the wiring planes.

According to an exemplary embodiment of the invention, a component carrier is provided which has a component with multiple pads on a surface of the component. In order to efficiently provide a fan-out structure/redistribution structure, the pads are electrically connected with an electronic periphery by at least one or more electrically conductive connection structures guiding the pad connections into different parallel wiring planes at different vertical levels. This may be accomplished by configuring the electrically connective connection structures to be composed of horizontal wiring traces (preferably embodied as direct galvanic lithographic component connection) in combination with (for at least a part of the connection structures) one or more (in particular directly stacked) vertical interconnects. By taking this measure, a simply manufacturable connection even of a large number of pads of a component may be made possible in a highly compact way. This may also enable obtaining a high current component sourcing in combination with an efficient heat transfer. The described fan-out architecture may be advantageously applied in particular to components with high number of input/output connections and/or high density of input/output connections. The described concept is also perfectly compatible with fine line structuring and the requirements of power applications and high frequency applications.

In the following, further exemplary embodiments of the method and the component carrier will be explained.

According to an exemplary embodiment of the invention, the component is an active component, in particular a semiconductor chip. Components capable of controlling current by means of another electrical signal may be denoted as active components (for instance semiconductor chips). Components incapable of controlling current by means of another electrical signal may be called passive devices. Resistors or capacitors are examples for passive components. For active components with frequently quite high number of pads, the advantageous effects of the described wiring architecture is particularly pronounced.

According to an exemplary embodiment of the invention, the component has at least 5 pads on the main surface, in particular at least 10 pads, more particularly at least 30 pads. In particular with components having such a high number of input/output connections, the described wiring architecture is particularly advantageous.

According to an exemplary embodiment of the invention, the first wiring plane is identical to or encompasses the main surface of the component with the plurality of pads. In such an embodiment, the first electrically conductive connection structure may directly contact the pad and may fully lie in a plane corresponding to the main surface of the component. In such an embodiment, the first electrically conductive connection structure in the first wiring plane may be formed by direct galvanic lithography. As a result, a component carrier with high-performance fan-out layer structure is obtained which can be manufactured in a vertically highly compact way.

According to an exemplary embodiment of the invention, the first electrically conductive connection structure comprises or consists of a first electrically conductive trace extending along a horizontal direction. In other words, no vertical interconnects are necessary in such a configuration for contacting one or more pads in the first wiring plane. In contrast to this, one or more coplanar first traces alone may connect the corresponding pad(s). Such a configuration may be accomplished by a direct galvanic lithography manufacturing architecture.

According to an exemplary embodiment of the invention, the first wiring plane is different from the main surface of the component with the plurality of pads, in particular is displaced parallel to the main surface of the component with the plurality of pads. In such an embodiment, the first wiring plane may be arranged between the main surface of the component with the plurality of pads and the second wiring plane. Consequently, already the first wiring plane is displaced parallel with regard to the main surface in this embodiment, in particular by distance corresponding to a vertical interconnect structure such as a copper filled laser via. Such a design may be advantageous in a scenario in which there is not sufficient space for forming the first electrically conductive connection structure in the same plane as the main surface of the component.

According to an exemplary embodiment of the invention, the first electrically conductive connection structure is composed of (in particular only) a first trace extending along a horizontal direction and a (in particular first) vertical through-connection in direct contact with the first trace. In particular, the first electrically conductive connection structure may comprise a first vertical through connection which directly contacts the first pad and may comprise a trace in the first wiring plane which directly contacts the first vertical through connection. Such an architecture has the advantage that it does not require any limitations in the plane according to the main surface of the component, since the lowermost first wiring structure is here formed in a plane displaced parallel with regard to the main surface of the component.

According to an exemplary embodiment of the invention, the second wiring plane is different from the main surface of the component with the plurality of pads and is different from the first wiring plane. By displacing the second wiring plane with regard to both the pad array of the component as well as the first wiring plane, a spatially clearly defined redistribution structure can be obtained allowing to three-dimensionally spread the pad connections.

According to an exemplary embodiment of the invention, the second electrically conductive connection structure is composed of (in particular only) a second trace extending along a horizontal direction in the second wiring plane and at least one directly connected (in particular second) vertical through-connection, in particular a plurality of directly connected (in particular second) vertical through-connections, connecting the second pad with the second trace. In particular, the second electrically conductive connection structure may comprise a plurality of directly connected second vertical through connections, wherein a lowermost of the second vertical through connections directly contacts the second pad, and may comprise a trace in the second wiring plane which directly contacts an uppermost of the second vertical through connections. Thus, the general architecture of forming the second electrically conductive connection structure in comparison with the first electrically conductive connection structure may be substantially identical with the difference that a further or additional vertical interconnect (such as a copper filled laser via) is foreseen for the second electrically conductive connection structure. Thus, a homogeneous manufacturing and a homogeneous material composition in an interior of the component carrier may be achieved. This, in turn, may advantageously suppress undesired effects such as delamination, warpage, etc.

According to an exemplary embodiment of the invention, a third electrically conductive connection structure of the electrically conductive layer structures electrically connects a third pad of the pads up to (in particular only up to) or into a third wiring plane being different from the first wiring plane and the second wiring plane. In particular, the third electrically conductive connection structure may be composed of a third trace extending along a horizontal direction in the third wiring plane and a plurality of, in particular at least three, directly connected (in particular third) vertical through-connections connecting the third pad with the third trace. Thus, the general architecture of forming the third electrically conductive connection structure in comparison with the second electrically conductive connection structure may be substantially identical with the difference that, in turn, a further or additional vertical interconnect (such as a copper filled laser via) is foreseen for the third electrically conductive connection structure. In a corresponding way, one or more further electrically conductive connection structures (i.e. a fourth, a fifth, etc.) may be added in the event of addition-al pads on the main surface to be contacted, while maintaining the general manufacturing architecture. Thus, the multilevel fan-out concept according to an exemplary embodiment of the invention may be easily scaled for larger numbers of pads.

According to an exemplary embodiment of the invention, in a plan view on the main surface of the component having the plurality of pads, the second trace fully covers the first trace. Correspondingly, the third trace may fully cover the first trace and the second trace in the mentioned plan view. Thus, a highly ordered and highly symmetric arrangement may be obtained.

However, alternatively, the second trace may, in the described plan view, only partially cover the first trace or may not cover the first trace at all. Additionally or alternatively, the third trace may, in the described plan view, only partially cover the first trace and/or the second trace or may not cover the first trace and/or the second trace at all.

According to an exemplary embodiment of the invention, in a plan view on the main surface of the component having the plurality of pads, electrically conductive connection structures of the electrically conductive layer structures connecting the pads extend in two perpendicular directions and/or in two opposing directions of this plane to connect the pads of the component up to different wiring planes. Hence, a three-dimensional fan-out becomes possible when the described arrangement of electrically conductive connection structures extends in a view on the plane of the main surface of the component into preferably perpendicular directions. In such a view (compare FIG. 2), wiring traces may extend from the main surface in two opposing horizontal directions and additionally in two opposing vertical directions. However, every other angle and/or direction is/are also possible in other embodiments. Thus, the wiring concept of exemplary embodiments of the invention is properly compatible with even huge numbers of pads to be connected, and can therefore serve for providing fan-out layers with very high number of input/output connections.

According to an exemplary embodiment of the invention, one of the pads being located more centrally on the main surface of the component is connected up to a wiring plane being vertically more distant from the main surface of the component than another of the pads located less centrally in, in particular at an edge of, the main surface of the component with the array of pads. As can be taken from FIG. 1, FIG. 2 or FIG. 12, more peripherally located pads may be guided out to wiring planes at lower levels than more centrally located pads. By taking this measure, the traces may be kept clearly separate, and undesired intersections may be avoided. This, in turn, allows suppressing undesired effects such as the formation of parasitic capacitances, etc.

According to an exemplary embodiment of the invention, at least part of the connection structures comprises a horizontally extending trace exclusively in the assigned wiring plane. In other words, a single horizontally extending trace may be combined with 0, 1, 2, 3 or any other higher number of vertical interconnects for forming the fan-out structure. Such a wiring can be manufactured in a simple way.

According to an exemplary embodiment of the invention, at least part of the connection structures may comprise a plurality of directly connected, stacked or staggered and at least partially metal filled laser vias. In this context, the term "directly connected" means that the vertical interconnect structures (in particular copper filled laser vias) may be formed directly on top of one another, in particular without intermediate material. Alternatively, horizontal pads (for instance made of copper) may be sandwiched between adjacent vertical interconnect structures.

According to an exemplary embodiment of the invention, in a cross-sectional view perpendicular to the main surface of the component (compare FIG. 1, FIG. 12), the first electrically conductive connection structure may extend continuously below the second electrically conductive connection structure. Correspondingly, in the cross-sectional view perpendicular to the main surface of the component (compare FIG. 1, FIG. 12), the second electrically conductive connection structure may extend continuously below the third electrically conductive connection structure. Also by taking this measure, undesired intersections of different wiring levels may be prevented. This may suppress crosstalk between different lines.

According to an exemplary embodiment of the invention, in a cross-sectional view perpendicular to the main surface of the component (compare FIG. 1, FIG. 12), at least one of the first electrically conductive connection structure, the second electrically conductive connection structure and the third electrically conductive connection structure is substantially L-shaped. In particular, the long leg of the L-shape may correspond to the horizontal wiring trace (for instance galvanic lithography structures or patterned metal foils), whereas the short leg of the L-shape may correspond to the one or more vertical interconnect structures (in particular copper filled laser vias). This also promotes a flat configuration and therefore a vertically compact component carrier.

According to an exemplary embodiment of the invention, the method comprises forming at least one of the electrically conductive connection structures exclusively by forming a galvanic lithographic structure, i.e. without forming vertical interconnect structures (such as copper filled laser vias) for this electrically conductive connection structure. For instance, a photoresist layer may be applied and may be patterned so as to define the horizontal wiring trace of a respective one of the electrically conductive connection structures. The material of such wiring traces may be, for in-stance, deposited galvanically (for instance by copper plating) in accordance with the pattern of the photoresist layer.

According to an exemplary embodiment of the invention, the method comprises forming a galvanic lithographic structure in combination with at least one connected laser drilled microvia, in particular multiple stacked or staggered laser drilled microvias, for forming at least one of the electrically conductive connection structures. In comparison to the previously described embodiment, the galvanic lithographic structure may also be combined with one or more laser drilled microvias. To manufacture the latter, a laser hole may be drilled through one of the electrically conductive layer structures, in particular until a horizontal wiring structure is exposed. Thereafter, the laser drilled hole may be filled with electrically conductive material (in particular copper). For instance, the filling may be done by firstly forming a seed layer (for instance by electroless plating), followed by the deposition of additional electrically conductive material (for instance galvanically).

According to an exemplary embodiment of the invention, the method comprises providing a base structure with a through-hole and placing the component in the through-hole. The base structure, in particular a core, may have a bottom surface aligned with a bottom surface of the component. The core may be a central portion of the stack having a cavity for accommodating the component. For instance, such a core may be made of fully cured material (such as FR4).

According to an exemplary embodiment of the invention, the method comprises attaching a temporary carrier to the base structure and attaching the component on the temporary carrier in the through-hole, at least partially filling gaps between the component, the base structure and the temporary carrier with a filling medium, and thereafter removing the temporary carrier. The temporary carrier may provide temporarily mechanical support for the component before the arrangement of base structure and component becomes rigid by a below described lamination procedure or the like. In particular, the method may further comprise laminating at least one of the at least one electrically insulating layer structure (serving as the filling medium) to an upper main surface of the base structure facing away from the temporary carrier. As an alternative filling medium, liquid adhesive may be dispensed in the cavity around at least part of the component. After curing the filling medium (for instance by laminating), the temporary carrier may then be removed, since the arrangement of base structure, component and filling medium (in particular adhesive or laminated dielectric material) may now be sufficiently rigid that the support function of the temporary carrier is no longer needed. For instance, such a temporary carrier may be a sticky tape which may be attached to the back side of the base structure and which may close a through-hole in the base structure for delimiting a respective cavity for the component. The respective component may then be placed on the sticky surface of the temporary carrier so as to ensure a correct positioning of the component. After having attached and connected (in particular by lamination) the electrically insulating layer structure to the base structure and the component while simultaneously filling the gaps in between with material of the electrically insulating layer structure to thereby obtain a rigid structure, the temporary carrier is no longer needed and can be removed from the back side. Thus, it is possible that the temporary carrier does not form part of the readily manufactured component carrier. Nevertheless, the temporary carrier may contribute to the spatially accurate positioning of the component in the base structure.

According to an exemplary embodiment of the invention, the method comprises forming the electrically conductive connection structures as redistribution layer after embedding the component in the stack. In the context of the present application, the term "redistribution structure" may particularly denote an array of interconnected electrically conductive elements of the connection structures which are configured to translate between relatively small dimensions of structures of a respective component (such as pad dimensions and/or distances of a semiconductor component) and larger dimensions of structures of component carrier technology (such as the dimension of exterior pads and traces of a printed circuit board (PCB)). A redistribution structure may also be denoted as a circuitry transferring a first spatial spacing (in particular a narrower spacing) of input/output contacts (in particular at a position of an embedded component such as a semiconductor chip) into a different second spatial spacing (in particular a wider spacing) of input/output contacts (in particular at an external position of a component carrier such as a printed circuit board). In other words, an electric fan-out function may be provided by a redistribution structure.

According to an exemplary embodiment of the invention, the method comprises forming a trace of at least one of the electrically conductive connection structures extending along a horizontal direction by one of the group consisting of a fully additive processing, a semi-additive processing, and a subtractive processing. Fully additive processing may involve forming a plating catalyst and covering the latter by a patterned photoresist. Remaining exposed portions of the plating catalyst may then be covered by deposited further metal. What concerns semi-additive of processing, a metallic seed layer may be formed (for instance by electroless plating, physical vapor deposition or chemical vapor deposition), a patterned photo-resist may be applied, and further metallic material may be deposited (for instance by a galvanic process) in accordance with the pattern of the photoresist. Thereafter, the photoresist and the previously covered portion of the seed layer may be removed. In terms of subtractive processing, a patterned photoresist may be formed on a metallic sheet, wherein the latter is then etched in accordance with the pattern of the photoresist to remove metallic material and maintain only the trace. In all three cases, the used metal may be preferably copper.

According to an exemplary embodiment of the invention, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

According to an exemplary embodiment of the invention, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

According to an exemplary embodiment of the invention, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure and/or thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based Build-Up films or polymer compounds like Polyimide, Polybenzoxazole, or Benzocyclobutene.

According to an exemplary embodiment of the invention, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, glass-spheres, multi-layer glass, glass-like materials), prepreg material, photo-imageable dielectric material, polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Although prepreg, FR4, or epoxy-based Build-Up Film or photo-imageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure. Teflon® is a registered trademark of the Chemours Company FC of Wilmington, Del., U.S.A.

According to an exemplary embodiment of the invention, the electrically conductive layer structures comprise at least one of the group consisting of copper, aluminum, nickel, silver, gold, palladium, and tungsten.

Although copper is usually preferred, other materials or coated versions thereof are possible as well, in particular coated with supra-conductive material such as graphene.

The at least one component (and/or at least one further component which may be embedded in the component carrier and/or may be surface mounted on the component carrier) can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

According to an exemplary embodiment of the invention, the component carrier is a laminate-type component carrier. In such an embodiment, the component carrier is a compound of multiple layer structures which are stacked and connected together by applying a pressing force, if desired accompanied by heat.

BRIEF DESCRIPTION OF THE DRAWINGS

FIG. 3, FIG. 4, FIG. 5, FIG. 6, FIG. 7, FIG. 8, FIG. 9, FIG. 10 and FIG. 11 illustrate cross-sectional views of structures obtained during carrying out a method of manufacturing a component carrier with an embedded component, as shown in FIG. 11, according to an exemplary embodiment of the invention.

FIG. 12 illustrates a cross-sectional view of a component carrier according to another exemplary embodiment of the invention.

DETAILED DESCRIPTION OF ILLUSTRATED EMBODIMENTS

Figure 1:
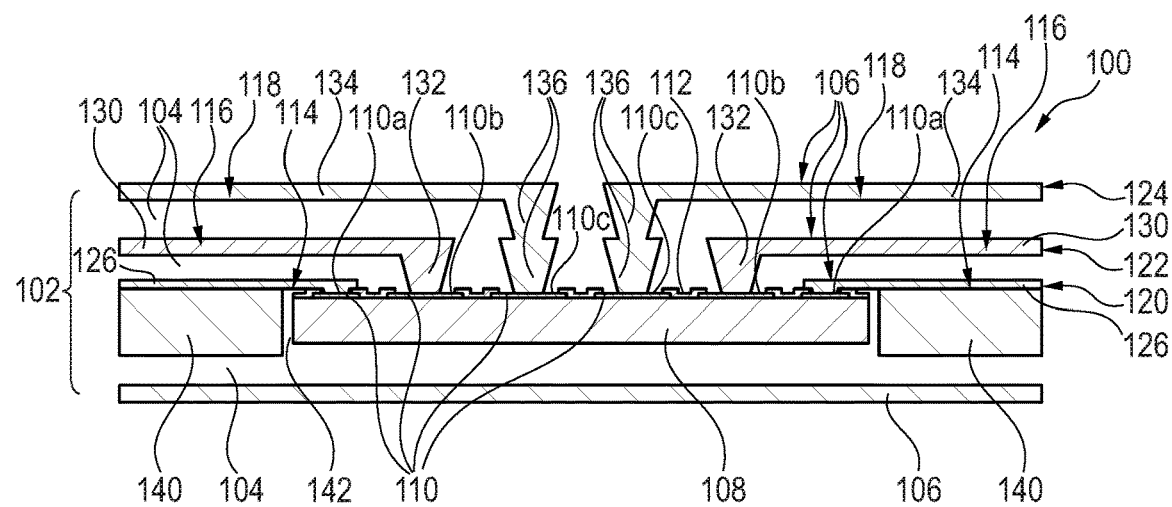
FIG. 1 illustrates a cross-sectional view of a component carrier according to an exemplary embodiment of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before referring to the drawings, exemplary embodiments will be de-scribed in further detail, some basic considerations will be summarized based on which exemplary embodiments of the invention have been developed.

According to an exemplary embodiment of the invention, a component carrier is provided which is configured as a multi-level fan-out embedded component package.

Conventionally, a component carrier with embedded component may be formed with a single level fan-out connection. However, such a configuration may limit the number of input/output connections and the density of the component, because of missing fan-out space and connection opportunities.

In order to at least partially overcome the above-mentioned and/or other shortcomings, an exemplary embodiment of the invention carries out a high accuracy galvanic lithographic component connection. Highly advantageously, this may be combined with the formation of laser drilled microvias. As a result, a high current component sourcing can be combined advantageously with a high-performance heat transfer. Thus, an exemplary embodiment of the invention provides a fan-out concept which is in particular highly advantageous for components with high number of input/output connections and/or high density of input/output connections. In particular, this may enable fine line structuring combined with power applications.

According to an exemplary embodiment of the invention, a high accuracy galvanic lithographic component connection may be advantageously combined with laser drilled microvias. It is further possible to provide multiple levels of laser drilled microvias to allow a fan-out of high I/O count and/or high I/O density from one or more components over multiple layers. Such a mixed or hybrid usage of different connection technologies may give the opportunity for embedding of nearly any type of components. Further-more, such an architecture may contribute to an adaptation of an embed-ding process for embedding technologies with further increased performance.

According to an exemplary embodiment, a multi PCB layer fan-out connection can be implemented in a component carrier using both galvanic lithographic connection structures and laser drilled microvias as well as stacked or staggered laser drilled microvias to connect an embedded component.

As a result, substantially no component design limitation remains in regard of number and density of input/output connections. In particular, exemplary embodiments of the invention enable component pad enlargement by implementing a galvanic lithographic process to increase a registration tolerance in particular for high density integration (HDI) connection for connected layers. Furthermore, exemplary embodiments of the invention enable an active heat transfer management, in particular by variation of microvia diameter and/or copper thickness. Furthermore, a foot print reduction of an embedded component may become possible due to higher possible density of input/output connections. Furthermore, the electrically conductive connection structures, in view of their configuration, may contribute to improve the electromagnetic radiation shielding capability of the component carrier. This may be in particular advantageous for high-frequency applications.

Figure 2:
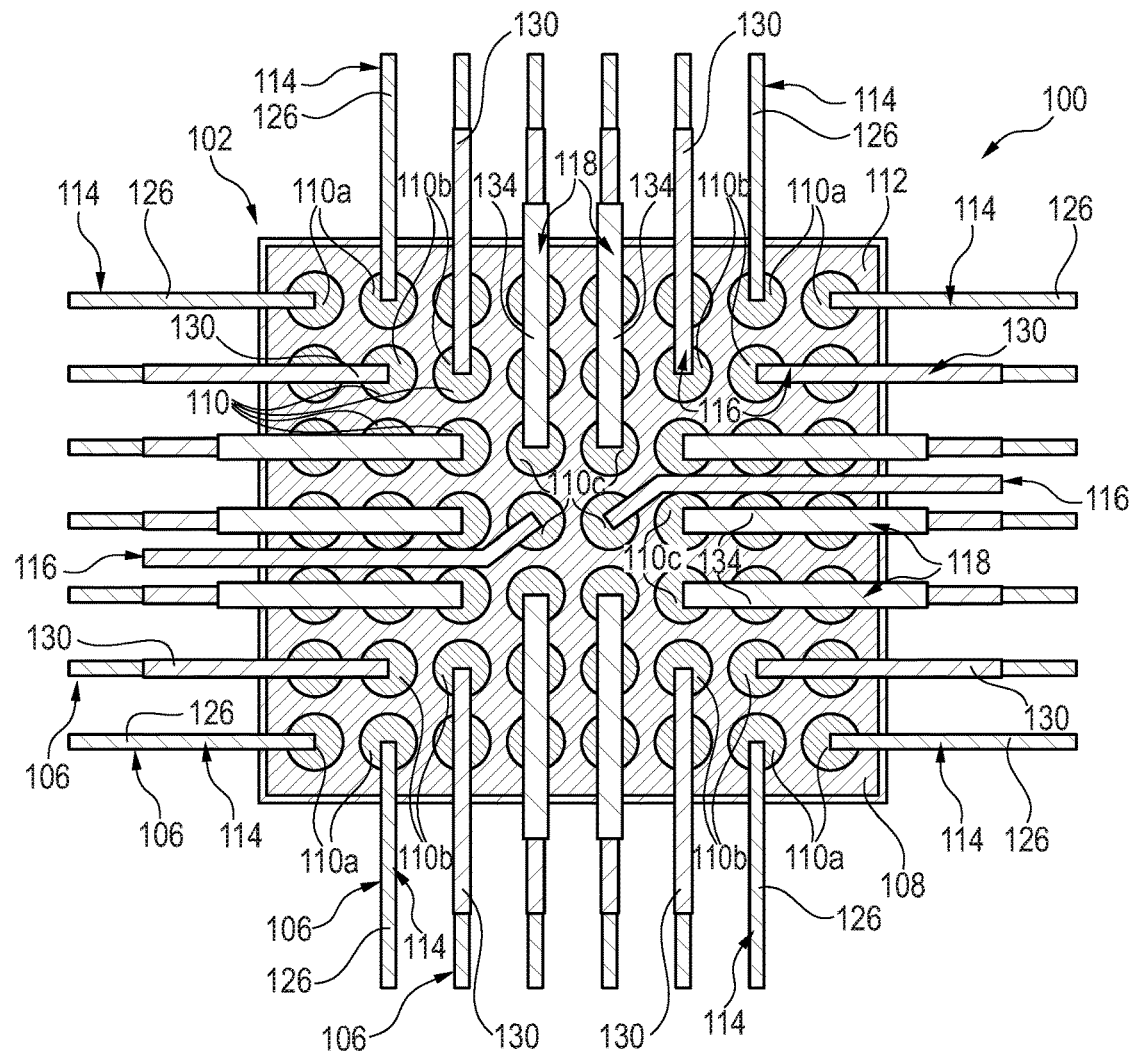
FIG. 2 illustrates a plan view of a component carrier according to an exemplary embodiment of the invention.

FIG. 1 illustrates a cross-sectional view of a component carrier 100 according to an exemplary embodiment of the invention. FIG. 2 illustrates a plan view of a component carrier 100 according to an exemplary embodiment of the invention. Although the embodiment of FIG. 2 is not identical to the embodiment of FIG. 1 (in particular in terms of a number of pads 110), both embodiments are very similar and will be described in the following together.

In the shown embodiments, the component carrier 100 is embodied as printed circuit board (PCB). The component carrier 100 according to FIG. 1 and FIG. 2 comprises a laminated layer stack 102 composed of multiple electrically conductive layer structures 106 and multiple electrically insulating layer structures 104.

The electrically conductive layer structures 104 may comprise patterned metal layers (such as patterned copper foils, etc.) and metallic vertical interconnects. The vertical interconnects may be formed, for example, by mechanically drilling or laser drilling. Correspondingly formed drill holes may then be at least partially filled with electrically conductive material (for instance copper), for instance by a combination of electroless plating and subsequent galvanic plating. In the shown embodiment, the vertical interconnects are formed by forming holes by laser drilling and subsequently filling the holes by copper plating.

The electrically insulating layer structures 104 may comprise laminated layers which may be made of resin (in particular of epoxy resin), optionally additionally comprising reinforcing particles (such as glass fibers or glass spheres). For instance, the electrically insulating layer structures 104 may be made of prepreg or FR4. The electrically insulating layer structures 104 also comprise a central base structure 140 with a cavity 142. The base structure 140 may for instance be made of a fully cured dielectric material such as FR4.

The electrically insulating layer structures 104 (e.g. a functional dielectric layer) may be configured for thermal conductivity. Accordingly, the electrically insulating layer structure 104 may have the technical effect that heat being emitted by the component 108 can be guided from the component in order to improve reliability of the component.

Further, the electrically insulating layer structure 104 is configured for high-frequency, HF, shielding or electromagnetic interference, EMI, shielding. Accordingly, the electrically insulating layer structure 104 may have the technical effect that the electromagnetic compatibility can be increased and that an undistributed signal generating, signal transmitting and signal distribution can be ensured.

Furthermore, the electrically insulating layer structure 104 may be configured for capacitive decoupling using ceramic filled polymers. Accordingly, the electrically insulating layer structure 104 may have the technical effect that the component 108 can be shielded from capacitive influences of other components.

Furthermore, the electrically insulating layer structure 104 may be configured for cushioning (low modulus material). Accordingly, the electrically insulating layer structure 104 may have the technical effect that mechanically stress acting on the component carrier 100 can be reduced such that the reliability of the component 108 can be increased even when the component carrier operates in a stressful condition respectively harsh environment. As can be taken from FIG. 1 and FIG. 2 as well, an active electronic component 108 is embedded in the stack 102, more precisely in the cavity 142 of the base structure 140. The component 108 comprises an—in the shown embodiment rectangular and matrix-like—array of electrically conductive pads 110 (for instance made of copper) on an upper main surface 112 of the component 108. Six pads 110 are visible in FIGS. 1 and 56 pads 110 are provided in FIG. 2. According to FIG. 1, all pads 110 are formed face-up on the same (here upper) main surface 112 of the component 108. The component 108 may be configured as a semiconductor chip, more specifically as a microprocessor. It is however also possible that the component 108 is an application specific integrated circuit (ASIC), a power management integrated circuit (PMIC), a direct current (DC) converter, etc.

In order to electrically (and optionally also thermally) connect the pads 110, multiple electrically conductive connection structures 114, 116, 118 are foreseen for establishing a three-dimensional ordered fan-out structure: A first electrically conductive connection structure 114 of the electrically conductive layer structures 106 electrically connects most peripherally located first pads 110a of the pads 110 up to and into a first wiring plane 120. A second electrically conductive connection structure 116 of the electrically conductive layer structures 106 electrically connects less peripherally and more centrally located second pads 110b of the pads 110 up to and into a second wiring plane 122 located vertically higher than the first wiring plane 120 (i.e. located more distant from the main surface 112). A third electrically conductive connection structure 118 of the electrically conductive layer structures 106 electrically connects even more centrally third pads 110c of the pads 110 up to and into a third wiring plane 124 being different from the first wiring plane 120 and the second wiring plane 122. In FIG. 2, two additional central pads 110c are connected by the second electrically conductive connection structure 116.

As can be taken from FIG. 1, the first wiring plane 120 is identical to the main surface 112 of the component 108 with the plurality of pads 110. Accordingly, the first electrically conductive connection structure 114 consists only of first traces 126 extending along a horizontal direction. Hence, the first electrically conductive connection structure 114 directly contacts the first pads 110a and lies fully in a plane corresponding to the main surface 112 of the component 108.

Again referring to FIG. 1, the second electrically conductive connection structure 116 is composed of second traces 130 extending along a horizontal direction in the second wiring plane 122 and one directly connected vertical through-connection 132 connecting a respective one of the second pads 110b with a respective one of the second traces 130.

Still referring to FIG. 1, the third electrically conductive connection structure 118 is composed of third traces 134 in the third wiring plane 124 and two directly stacked or directly connected vertical through-connections 136 connecting a respective third pad 110c with a respective third trace 134.

In the plan view of FIG. 2 on the main surface 112 of the component 108 having the plurality of pads 110, all the electrically conductive connection structures 114, 116, 118 of the electrically conductive layer structures 106 connecting the pads 110 extend in two perpendicular directions (in the shown embodiment horizontally and vertically) of this plane to connect the pads 110 of the component 108 up to the different wiring planes 120, 122, 124. Constituents of the electrically conductive connection structures 114, 116, 118 thus extend outwardly via all four side edges of the component 108.

As shown in each of FIG. 1, groups of pads 110 being located more centrally on the main surface 112 of the component 108 are connected up to a respective wiring plane 120, 122, 124 being vertically more distant from the main surface 112 of the component 108 than other groups of the pads 110 which are located less centrally in the main surface 112 (i.e. closer to a respective edge) of the component 108. This design rule is substantially fulfilled in FIG. 2 as well (with the exception of the two additional central pads 110c which are connected by the second electrically conductive connection structure 116).

As shown in FIG. 1, each of the connection structures 114, 116, 118 comprises horizontally extending traces 126, 130, 134 running exclusively in the assigned wiring plane 120, 122, 124. Moreover, the connection structures 116, 118 comprises one or two directly connected, stacked and copper filled laser vias.

In the cross-sectional view of FIG. 1 perpendicular to the main surface 112 of the component 108, the first electrically conductive connection structure 114 extends continuously below the second electrically conductive connection structure 116. The second electrically conductive connection structure 116 extends, in turn, continuously below the third electrically conductive connection structure 118. In the viewing direction of FIG. 1, the second electrically conductive connection structure 116 and the third electrically conductive connection structure 118 are each substantially L-shaped. In the shown embodiment, the longer leg of the L extends horizontally and the shorter leg of the L extends vertically. However, the shorter leg of the L may extend horizontally and the longer leg of the L may extend vertically in another embodiment. In the illustrated embodiment, the first electrically conductive connection structure 114 is shaped as a substantially straight horizontal line.

The level of the first electrically conductive connection structure 114 may be denoted as pure galvanic lithographic fan-out region. The level of the second electrically conductive connection structure 116 is configured as a microvia fan-out structure. Furthermore, the level of the third electrically conductive connection structure 118 is configured as a further microvia fan-out structure. In particular the implementation of the first electrically conductive connection structure 114 on pad level, i.e. at the same vertical level as the main surface 112 of the component 108, provides significant advantages in terms of increasing the compactness of the component carrier 100. Also the design rule according to which—generally—pads 110 which are located more centrally in the main surface 112 of the component 108 (see for instance pads 110c) are guided towards higher levels of wiring planes (see for instance reference numeral 124) than pads 110 which are located less centrally in the main surface 112 of the component 108 (see for instance pads 110a), which are guided towards lower levels of wiring planes (see for instance reference numeral 120), ensures a simple manufacturability. At the same time, this arrangement also allows for an efficient spatial spreading of electrical signals and heat without the danger of excessive interaction between electrically conductive connection structures 114, 116, 118. The described simple concept in terms of guiding electric signals and heat out of an interior of the component carrier 100 towards an electronic periphery thereof is perfectly compatible with a high I/O count (i.e. a large number of pads 110 and thus a large number of input/output terminals) and a high density of electrically conductive connection structures 114, 116, 118.

As can be taken from FIG. 1 and FIG. 2, the shown arrangement of electrically conductive connection structures 114, 116, 118 results in the formation of an efficient and compact redistribution structure (in particular redistribution layer, RDL) accomplishing a transfer between the small dimensions of semiconductor chip technology at the level of the pads 110 to the larger dimensions of component carrier (in particular PCB) technology at an exterior main surface of the component carrier 100. Such a redistribution can be accomplished, according to exemplary embodiments of the invention, in all three dimensions, i.e. in the two dimensions defined by the plane of the main surface 112 of the component 108, as well as the third dimension perpendicular to the main surface 112 (i.e. defined by the stacking direction of the copper filled laser vias according to FIG. 1). The fan-out and spatial spreading of both electric signals as well as heat occurs in an upward direction according to FIG. 1. Hence, a direct and spatially compact redistribution from smaller metallic structures in an interior of the component carrier 100 towards larger metallic structures at an exterior surface of the component carrier 100 may be achieved with low effort and high efficiency.

In the plan view on the main surface 112 of the component 108 according to FIG. 2, each of the second traces 130 fully covers or overlies a respective one of the first traces 126 and each of the third traces 134 fully covers or overlies a respective one of the second traces 130. The result is a highly symmetric structure. However, it is alternatively possible that at least a part of the second traces 130 only partially covers or overlies (or even does not cover or overlie at all) a respective one of the first traces 126. Correspondingly, at least part of the third traces 134 may only partially cover or overlie (or may not cover or overlie at all) a respective one of the second traces 130.

FIG. 3 to FIG. 11 illustrate cross-sectional views of structures obtained during carrying out a method of manufacturing a component carrier 100 with an embedded component 108, shown in FIG. 11, according to an exemplary embodiment of the invention.

Referring to FIG. 3, a base structure 140 is provided as a continuous plate of fully cured material. Thus, the described procedure starts with a core laminate, for instance made of FR4 material (optionally comprising copper structures on top and/or on bottom (not shown in FIG. 3).

Referring to FIG. 4, registration holes 150 (which are here embodied as through holes) may be formed in the base structure 140. Hence, the structure shown in FIG. 3 can be made subject to a mechanical drilling procedure for assembly registration.

Referring to FIG. 5, a cavity may be formed by forming a through hole 142 in the base structure 140. Such a cavity cutting process may be carried out for instance by mechanically drilling, milling, laser processing, etc. Thus, the base structure 140 of FIG. 5 is provided with a through-hole 142 sized for accommodating component 108 therein (compare FIG. 7).

Referring to FIG. 6, a temporary carrier 144 can be attached to the bottom surface of the base structure 140 and may close the through hole 142 from a bottom side. For instance, the temporary carrier 144 may be a sticky tape with or without holes, a copper foil, a plate shaped core, etc. The temporary carrier 144, together with the through hole 142, defines an accommodation volume for subsequently accommodating the component 108 therein.

Referring to FIG. 7, a component assembly is carried out. Thus, the component 108 is placed in the through-hole 142 which forms, together with the temporary carrier 144, a cavity for accommodating the component 108. During this process, a bottom surface of the component 108 is attached on the temporary carrier 144 in the through-hole 142. As shown in FIG. 7, the component 108 is placed with its array of pads 110 on its main surface 112 onto the temporary carrier 144. Thus, the component 108 is embedded in the component carrier 100 face-down in the shown embodiment. Also, a face-up configuration or a combined face-up and face-down configuration are possible.

Referring to FIG. 8, remaining gaps 146 between the component 108, the base structure 140 and the temporary carrier 144 are filled with a filling medium 148. For instance, a laminated layer stack 102 may be formed in this context.

For instance, at least one at least partially uncured electrically insulating layer structure 104 (for instance a prepreg layer) may be laminated on both the base structure 140 and the component 108 for this purpose. During this lamination process, i.e. the application of heat and/or pressure, dielectric material of the previously at least partially uncured electrically insulating layer structure 104 may melt or may become liquid and may also flow in the gaps 146 between component 108 and base structure 140. During this lamination, the previously at least partially uncured electrically insulating layer structure 104 may be cured by cross-linking of a resin material thereof. After that, the cross-linked and cured material will re-solidify and may then fix the component 108 in place in the through hole 142 of the core or stack type base structure 140. As a result, the shown laminated layers stack 102 is obtained. Although not shown, also an electrically conductive layer structure 106 may be connected to the stack 102 already at the manufacturing stage of FIG. 8. It is however also possible to connect electrically conductive layer structures 106 to the stack 102 later (see for instance FIG. 10 and FIG. 11).

It is also possible to carry out an RCF (resin coated foil) lamination procedure for filling the gaps 146 and therefore the cavity.

Referring to FIG. 9, the temporary carrier 144 can now be removed (for instance peeled off) from the meanwhile rigid arrangement composed of base structure 140, component 108 and layer structure 104 after the laminating.

After removal of the temporary carrier 144, contour routing and X-ray drilling procedures may be carried out.

As a result of the described procedure, the pads 110 are now exposed at the lower main surface of the structure shown in FIG. 9.

Referring to FIG. 10, the first electrically conductive connection structure 114 is formed on a part of the pads 110 and at the same vertical level exclusively by forming a galvanic lithographic structure. More specifically, the process electrically connects first pads 110a of the pads 110 into a first wiring plane 120 corresponding to the plane of the main surface 112 by the first electrically conductive connection structure 114 of the electrically conductive layer structures 106.

The formation of the first electrically conductive connection structure 114 may be carried out in the present embodiment by an additive conductor formation procedure, for instance as follows: Firstly, a sputtering procedure can be carried out. Additionally, a copper plating process may be executed. The shape of the first electrically conductive connection structure 114 may then be defined by carrying out a lithography process.

Referring to FIG. 11, a further galvanic lithographic structure is formed in combination with connected laser drilled microvias for forming the second electrically conductive connection structure 116. This is accomplished for electrically connecting second pads 110b of the pads 110 into a second wiring plane 122 being different from the first wiring plane 120 by the second electrically conductive connection structure 116 of the electrically conductive layer structures 106.

In the shown embodiment, the second electrically conductive connection structure 116 can be manufactured as follows. Firstly, one or more dielectric layers (which are also denoted as electrically insulating layer structures 104) may be added (for instance by pressing or lamination). Then, a laser drilling procedure for forming microvias may be carried out. Subsequently, the laser drilled holes may be filled with electrically conductive material, for instance by copper plating. Thereafter, a lithography process can be carried out.

Although not shown, it is subsequently possible to form at least one further electrically conductive connection structure (such as the electrically conductive connection structure 118 shown in FIG. 1 and FIG. 2).

Thus, the described procedure forms electrically conductive connection structures 114, 116, . . . as a redistribution layer after embedding the component 108 in the stack 102.

FIG. 12 illustrates a cross-sectional view of a component carrier 100 according to another exemplary embodiment of the invention.

As can be taken from a comparison of the embodiment of FIG. 12 with the embodiment of FIG. 1, a main difference is that, according to FIG. 12, also the first electrically conductive connection structure 114 comprises first vertical through connections 128 (embodied as single copper filled laser vias) which directly contact the first pad 110a. Each of the first vertical through connections 128 directly contacts a respective horizontal trace 126 in the first wiring plane 120. In other words, the first electrically conductive connection structure 114 of the embodiment of FIG. 12 is composed of only first traces 126 extending along a horizontal direction and first vertical through-connections 128 in direct contact with the third trace 126. Consequently, the first wiring plane 120 already lies above the main surface 112 of the component 108 according to FIG. 12. This architecture provides an alternative to the exclusively direct lithographic connection of the first electrically conductive connection structure 114 according to FIG. 1.

Correspondingly, the second electrically conductive connection structure 116 has two (rather than one) stacked copper filled laser vias as second vertical through connections 132. Thus, the second electrically conductive connection structure 116 of FIG. 12 comprises two directly connected second vertical through connections 132, wherein the lower of the second vertical through connections 132 directly contacts the second pad 110b. The trace 130 in the second wiring plane 122 directly contacts the upper of the two second vertical through connections 132. Accordingly, the third electrically conductive connection structure 118 has three (rather than two) stacked copper filled laser vias as third vertical through connections 136.

In the embodiment of FIG. 12, already the first wiring plane 120 is different from the main surface 112 of the component 108 with the plurality of pads 110. Thus, the first wiring plane 120 is arranged between the main surface 112 of the component 108 with the plurality of pads 110 and the second wiring plane 122 according to FIG. 12.

A skilled person will understand that the concepts described with respect to FIG. 1, FIG. 2 and FIG. 12 can be extended to further wiring planes so as to contact substantially any desired number of pads 110. Thus, exemplary embodiments of the invention can be implemented particularly efficiently when the number of pads 110 is sufficiently high, for instance at least 5, in particular at least 10, more particularly at least 30.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
a stack comprising at least one electrically insulating layer structure and a plurality of electrically conductive layer structures;
a component embedded in the stack and comprising an array of pads on a main surface of the component;
wherein a first electrically conductive connection structure of the electrically conductive layer structures electrically connects a first pad of the pads only up to a first wiring plane;
wherein a second electrically conductive connection structure of the electrically conductive layer structures electrically connects a second pad of the pads only up to a second wiring plane being different from the first wiring plane;
wherein a third electrically conductive connection structure of the electrically conductive layer structures electrically connects a third pad of the pads only up to a third wiring plane being different from the first wiring plane and the second wiring plane, wherein the third electrically conductive connection structure is composed of a third trace extending along a horizontal direction in the third wiring plane and a plurality of at least three, directly connected vertical through-connections connecting the third pad with the third trace.

2. The component carrier according to claim 1, further comprising one of the following features:
wherein the first wiring plane corresponds to the main surface of the component with the plurality of pads;
wherein the first wiring plane is different from the main surface of the component with the plurality of pads, in particular is parallel to the main surface of the component with the plurality of pads.

3. The component carrier according to claim 1, further comprising at least one of the following features:
wherein the second wiring plane is different from the main surface of the component with the plurality of pads and is different from the first wiring plane;
wherein the first wiring plane is arranged between the main surface of the component with the plurality of pads and the second wiring plane;
wherein the first electrically conductive connection structure consists only of a first trace extending along a horizontal direction.

4. The component carrier according to claim 1, wherein the first electrically conductive connection structure is composed of, in particular only, a first trace extending along a horizontal direction and a vertical through-connection in, in particular direct, contact with the trace.

5. The component carrier according to claim 1, wherein the second electrically conductive connection structure is composed of, in particular only, a second trace extending along a horizontal direction in the second wiring plane and at least one, in particular directly, connected vertical through-connection, in particular a plurality of directly connected vertical through-connections, connecting the second pad with the second trace.

6. The component carrier according to claim 4, wherein, in a plan view on the main surface of the component having the plurality of pads, the second trace only partially or fully covers the first trace, or does not cover the first trace at all.

7. The component carrier according to claim 1, wherein, in a cross-sectional view perpendicular to the main surface of the component, the first electrically conductive connection structure extends continuously below the second electrically conductive connection structure.

8. The component carrier according to claim 1, wherein, in the cross-sectional view perpendicular to the main surface of the component, the second electrically conductive connection structure extends continuously below the third electrically conductive connection structure.

9. The component carrier according to claim 1, further comprising at least one of the following features:
wherein, in a plan view on the main surface of the component having the plurality of pads, at least part of the electrically conductive connection structures extends in two perpendicular directions and/or in two opposing directions of this plane to connect the pads of the component up to different wiring planes;
wherein a respective one of the pads being located more centrally on the main surface of the component is connected up to a wiring plane having a vertically larger distance from the main surface of the component than a respective other one of the pads located less centrally in, in particular at an edge of, the main surface of the component;
wherein at least part of the connection structures comprises a horizontally extending trace exclusively in the assigned wiring plane;
wherein at least part of the connection structures comprises a plurality of directly connected, stacked or staggered and at least partially metal filled laser vias;

wherein, in a cross-sectional view perpendicular to the main surface of the component, at least one of the electrically conductive connection structures is substantially L-shaped;

wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an opto-electronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip;

wherein the electrically conductive layer structures comprise at least one of the group consisting of copper, aluminum, nickel, silver, gold, palladium, and tungsten, any of the mentioned materials being optionally coated with supra-conductive material such as graphene;

wherein the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein the component carrier is shaped as a plate;

wherein the component carrier is configured as one of the group consisting of a printed circuit board, and a substrate;

wherein the component carrier is configured as a laminate-type component carrier.

* * * * *